United States Patent [19]
Snelgrove

[11] Patent Number: 5,448,606
[45] Date of Patent: Sep. 5, 1995

[54] GRAY CODE COUNTER

[75] Inventor: Andrew H. Snelgrove, Ventura, Calif.

[73] Assignee: The United States of America as represented by the Secratary of the Navy, Washington, D.C.

[21] Appl. No.: 86,991

[22] Filed: Jun. 30, 1993

[51] Int. Cl.⁶ .................... H03K 21/38; H03M 7/16
[52] U.S. Cl. ........................................ 377/34; 377/38
[58] Field of Search ................................ 377/34, 38

[56] References Cited

U.S. PATENT DOCUMENTS

| | | | |
|---|---|---|---|
| 3,076,601 | 2/1963 | Goetz | 377/34 |
| 4,780,894 | 10/1988 | Watkins et al. | 377/34 |
| 5,097,491 | 3/1992 | Hall | 377/34 |
| 5,164,968 | 11/1992 | Otto | 377/34 |

*Primary Examiner*—John S. Heyman
*Attorney, Agent, or Firm*—David Kalmbaugh; Melvin Sliwka

[57] ABSTRACT

A Gray code counter is provided having identical modular circuits with each modular circuit providing a Gray code count sequence having a predetermined number of bits and an enable signal to enable a successive modular circuit of the Gray code counter. Each modular circuit of the Gray code counter enables a successive modular circuit only during certain predetermined counts of the Gray code count sequence. The number of modules required to implement the counter is determined by the number of binary bits per module and the total number of binary bits provided by the counter. The Gray code counter can operate either in an up mode count or a down mode count in accordance with the Gray code count sequence.

9 Claims, 4 Drawing Sheets

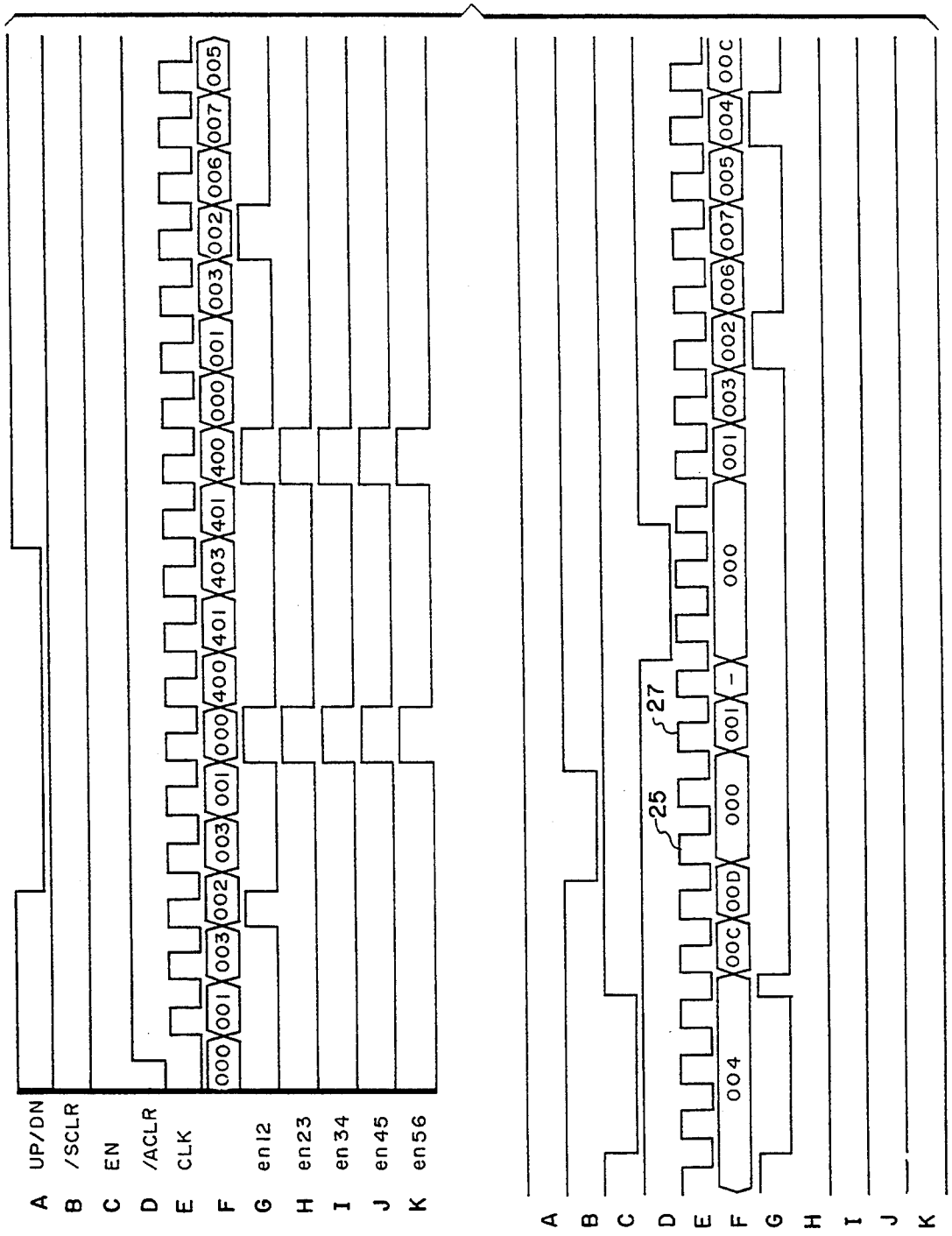

GRAY CODE COUNTER

BACKGROUND OF THE INVENTION

1. Field of the Invention

This invention relates generally to binary counter circuits and, in particular, to a Gray code counter that employs a modular type of sequencing.

2. Description of the Prior Art

Binary counters are used in virtually every digital computer or programmable controller, as well as many other types of digital systems. Many binary counters count sequentially, up or down, in accordance with a normal binary sequence. However, counting in a normal binary sequence results in bit pattern changes having multiple bit transitions. Since the bits of a binary counter do not transition at exactly the same instant, a binary counter can generate undesirable transition errors e.g., "glitches", at the output, for example, of decoding circuitry electrically coupled to the counter.

To overcome these problems, Gray code counters are often used. A Gray code is a binary code in which sequential numbers are represented by binary expressions, each of which differs from the preceding expression by one bit in one place only. Thus, Gray code counters have the advantage of providing a virtually glitch-free count sequence. Accordingly, when a low noise counter is required for a particular application, Gray code counters are typically used. For example, Gray code counters are used for applications such as the transmission of telemetry data.

However, Gray code counters have problems of their own. Unlike binary counters, whose individual bit transitions are dependent only upon the logical states of their immediately adjacent bits, a Gray code counter's individual bit transitions are dependent upon the logical state of all other bits within the counter. This has resulted in complex logic and circuit designs based upon complex logic equations representing the expressions or states of the counter required to define the counting sequence. Such complexity increases greatly as more bits are added, i.e., for longer count sequences. Furthermore, the complexity is exacerbated for Gray Counters designed to provide both up and down counting, i.e., incrementing and decrementing count sequences.

The complexity of Gray code counters has been caused by the interdependency of the individual counter bit transitions upon the logical states of all the other counter bits. Such interdependency has produced designs having interconnections for feedback and feedforward paths coupling to or across multiple counter stages. This causes the interconnections to differ from one stage to the next stage.

Many Gray code counter designs use clock signals for the individual counter stages which are not fully synchronous. These asynchronous counters use various means for gating the counter stages' clock signals. Other Gray code counters have been designed to operate completely asynchronously with no clock signal being used by the counter. Instead, these Gray code counters operate as ripple counters.

A Gray code counter's interstage connections are further affected when the counter is designed to provide both incrementing and decrementing count sequences. In this case, several, if not most, counter stages must be interconnected.

The inter-bit dependence of Gray code counters has resulted in counter designs which tend to be unique to each particular application. These prior art Gray code counters must generally be redesigned whenever a bit or bits are to be added to or removed from the count sequence. Such redesign has been further necessitated when it is desired that the Gray code counter selectively increment or decrement during its count sequence.

Furthermore, the inter-bit dependence of Gray code counters has caused this uniqueness of design to extend all the way down to the individual counter stages. The interfaces among the counter stages, including the clock signals, vary from one counter stage to the next. As a result, prior art Gray code counter designs have been either non-modular or non-synchronous, or both.

Thus, it would be desirable to have a Gray code counter design which is modular so that bits may be simply added to or removed from the count sequence by merely adding or removing counter stage modules without affecting the respective interfaces among the remaining counter stages. It would be further desirable to have a synchronous, modular Gray code counter design which can be selectively programmed to count up or down, i.e., increment or decrement during its count sequence.

SUMMARY OF THE INVENTION

The present invention overcomes some of the disadvantages of the prior art, including those mentioned above in that it comprises a relatively simple Gray code counter design which has modular counter stages. This modular design allows additional bits or counter stages to be added to the Gray code counter or deleted from the Gray code counter. Such additions or deletions of modular counter stages have no effect upon the respective interfaces of the individual modular counter stages.

The present invention further provides a modular Gray code counter which is fully synchronous. A single clock signal is used to directly clock every stage of the counter.

The present invention still further provides a synchronous, modular Gray code counter which can be selectively programmed to increment or decrement. A single-bit count control signal is used to program the Gray code counter to count up or count down. The Gray code counter of the present invention also provides for single bit control signals which enable the Gray code counter, which clear the Gray code counter asynchronously and which clear the Gray code counter synchronously.

Thus, a Gray code counter in accordance with the present invention provides a synchronous, fully modular Gray code counter capable of selectively counting up or counting down and having interstage interfaces unaffected by the number of bits in the count sequence.

These and other objectives, features and advantages of the present invention will be readily understood upon consideration of the following detailed description of the invention and the accompanying drawings.

BRIEF DESCRIPTION OF THE DRAWINGS

FIGS. 1-5 illustrate a Gray code counter or portions thereof in accordance with the present invention.

FIG. 1 is a block circuit diagram of an eleven bit Gray code counter, illustrating the use of five modules or building blocks to implement a Gray code count sequence;

FIG. 2 is a block circuit diagram for each of the five modules of FIG. 1;

FIG. 3 is a detailed electrical schematic diagram illustrating the logic circuitry for generating the enable signal provided by each of the modules of the Gray code counter of FIG. 1;

FIG. 4 is a state machine diagram illustrating the sequencing of the Gray code count for each of the modules of FIG. 1; and FIG. 5 illustrates a timing diagram of the operation of the eleven bit Gray code counter of FIG. 1.

DETAILED DESCRIPTION OF THE INVENTION

Figure 1:
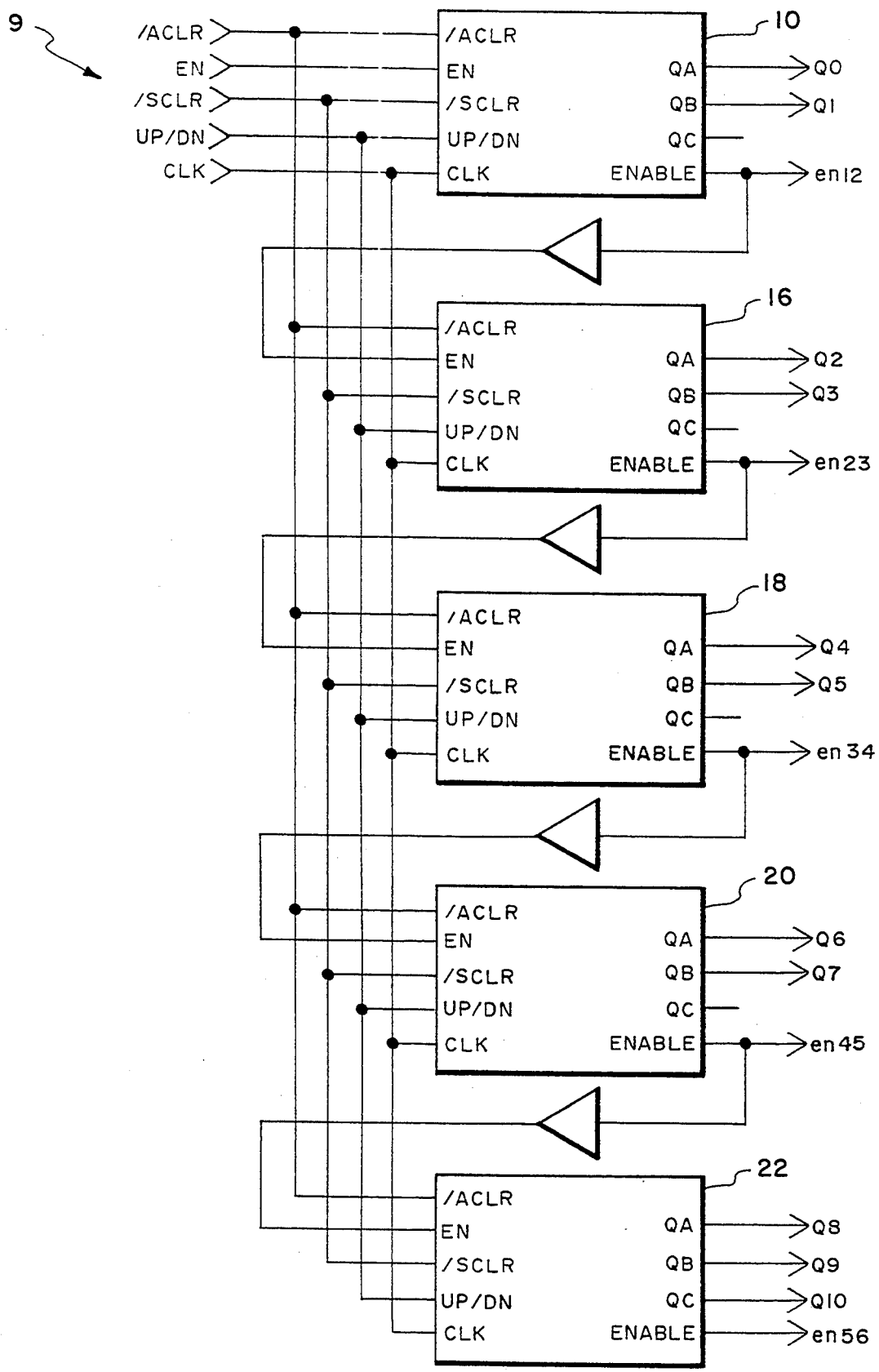

Referring to FIG. 1, there is shown an eleven bit Gray code counter, designated generally by the reference numeral 9, which constitutes a preferred embodiment of the present invention. Gray code counter 9 includes five modules or building blocks 10, 16, 18, 20 and 22 with each block 10, 16, 18, 20 and 22 providing three output bits QA, QB and QC and an enable signal which is active at the logic one state. Each block 10, 16, 18, 20 and 22 also has five inputs, one input of which receives the enable signal either from a preceding sequential building block or from an external source, not shown, which may be for example a digital computer. It should be noted that block 10 of Gray code counter 9 which provides the two least significant count bits Q0 and Q1 of each count receives the enable signal of FIG. 5C from the external source. It should also be noted that the enable signals of FIGS. 5G, 5H, 5I, 5J and 5K are respectively provided to the enable (EN) input of the next sequential module of Gray code counter 9 by the preceding module of Gray code counter 9. For example, module 16 which provides the Q2, Q3 count bits supplies the enable signal (en23) of FIG. 5H to the enable input of the next sequential module 18 of counter 9 which is the module providing the Q4 and Q5 count bits of each Gray code count.

Each module 10, 16, 18, 20 and 22 of Gray code counter 9 also receives from the external source the remaining control signals required by Gray code counter 9 to increment or decrement a count, to clock Gray code counter 9 and to clear Gray code counter 9, either through an asynchronous mode or a synchronous mode. The control signals provided to each module 10, 16, 18, 20 and 22 of Gray code counter 9 from the external source include the clock signal (CLK) of FIG. 5E, the asynchronous clear signal (/ACLR) of FIG. 5D, the synchronous clear signal (/SCLR) of FIG. 5B and the up/down count signal (UP/DN) of FIG. 5A. The asynchronous clear signal, FIG. 5D and the synchronous clear signal, FIG. 5B, are active at the logic zero state. When the up/down count signal of FIG. 5A is at the logic one state Gray code counter 9 operates in an up count mode. Similarly, when the up/down count signal of FIG. 5A is at the logic zero state Gray code counter 9 operates in a down count mode.

Figure 2:
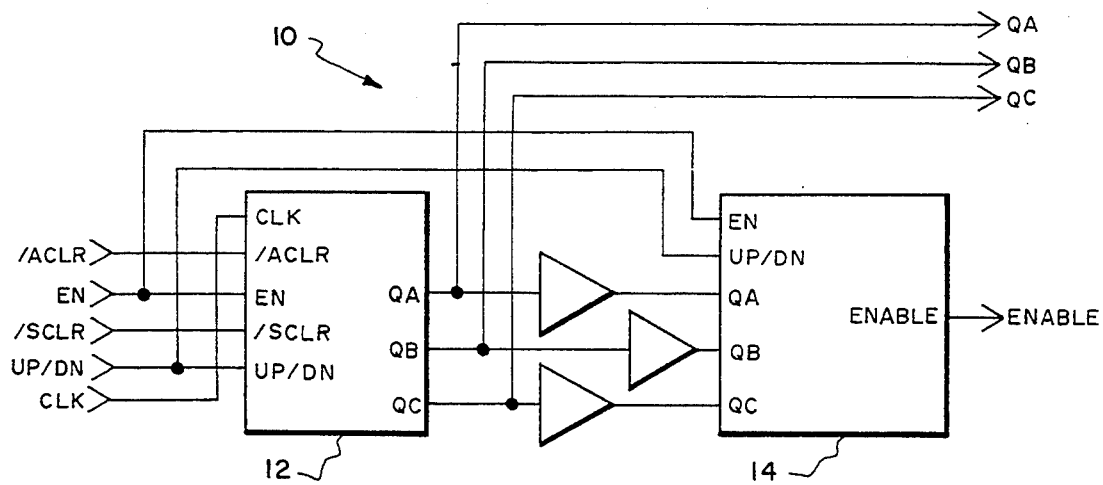

Referring to FIG. 2, there is shown a block circuit diagram for each of the modules 10, 16, 18, 20 and 22 of FIG. 1. Each of the modules 10, 16, 18, 20 and 22 is identical in structure and operation and thus the following discussion will be with respect to module 10 of Gray code counter 9, unless otherwise indicated.

Figure 4:
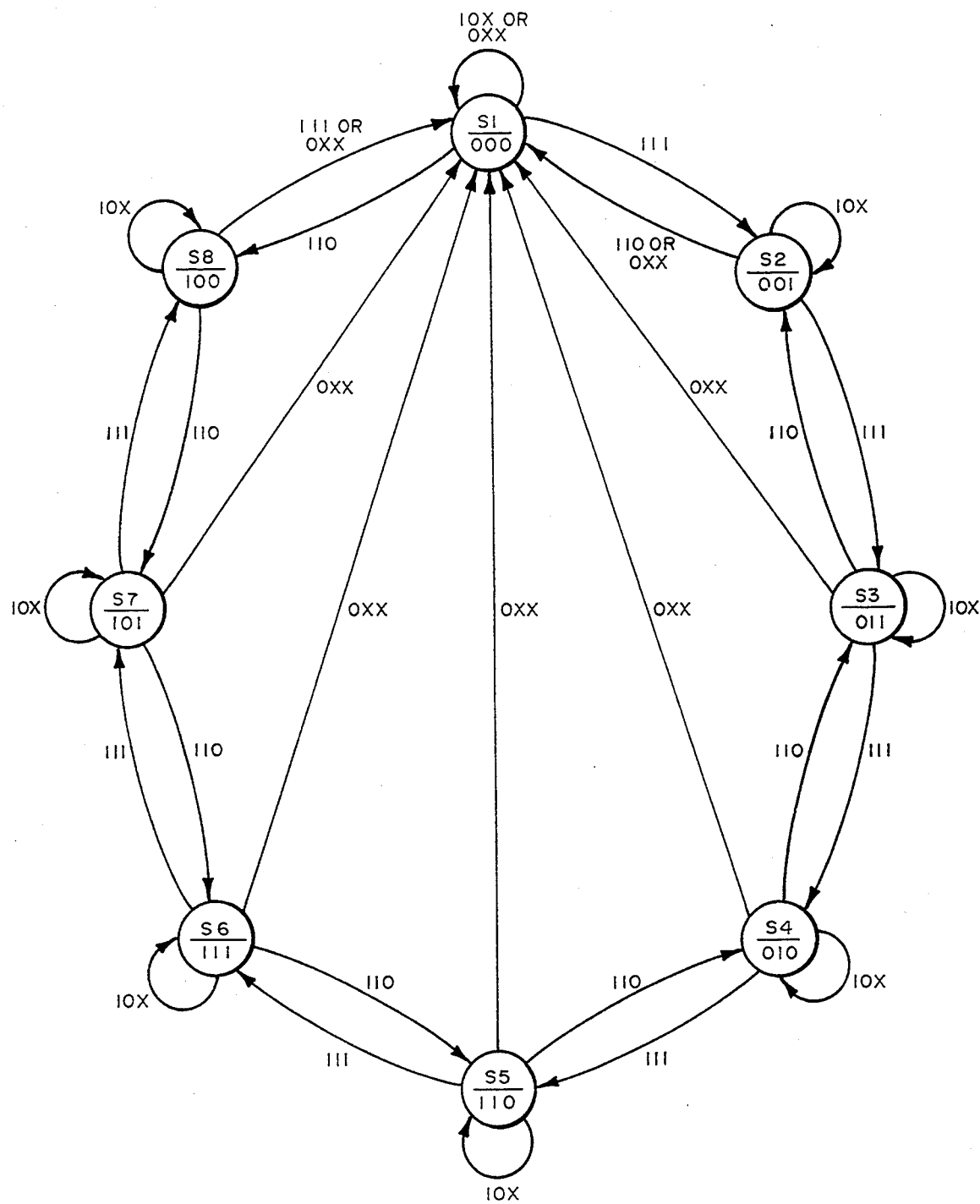

Referring to FIG. 4, there is shown a state machine diagram for circuit 12 of FIG. 2. Each circuit 12 provides a three bit Gray code count having bits QA, QB and QC with the count being dependent on the logic signals provided to the /SCLR input, the EN input and the UP/DN input of circuit 12. For example, if the Gray code counting sequence to be provided at the QA, QB and QC outputs of any one of the circuits 12 of counter 9 is to be as follows:

TABLE I

| COUNTING SEQUENCE FOR CIRCUIT 12 | | | |
| --- | --- | --- | --- |
| | QC | QB | QA |
| increment | 0 | 0 | 0 |
| | 0 | 0 | 1 |
| | 0 | 1 | 1 |
| | 0 | 1 | 0 |
| | 1 | 1 | 0 |
| | 1 | 1 | 1 |
| | 1 | 0 | 1 |
| | 1 | 0 | 0 | the /SCLR input, the EN input and the UP/DN input of circuit are respectively 1,1,1 and the state machine of FIG. 4 transitions from state S1 through states S2, S3, S4, S5, S6, S7 and state S8 and then returns to state S1.

In a like manner, if the Gray code counting sequence to be provided at the QA, QB and QC outputs of any one of the circuits 12 of counter 9 is to be as follows:

TABLE II

| COUNTING SEQUENCE FOR CIRCUIT 12 | | | |
| --- | --- | --- | --- |
| | QC | QB | QA |
| decrement | 0 | 0 | 0 |
| | 1 | 0 | 0 |
| | 1 | 0 | 1 |
| | 1 | 1 | 1 |
| | 1 | 1 | 0 |
| | 0 | 1 | 0 |
| | 0 | 1 | 1 |
| | 0 | 0 | 1 | the /SCLR input, the EN input and the UP/DN input of circuit 12 are respectively 1,1,0 and the state machine of FIG. 4 transitions from state S1 through states S8, S7, S6, S5, S4, S3 and state S2 and then returns to state S1.

Whenever the EN input to one of the modules 10, 16, 18, 20 or 22 of Gray code counter 9 transitions from the logic one state to the logic zero state, circuit 12, FIG. 2, is disabled and the state machine of FIG. 4 remains at the particular state the state machine was at when the logic one to logic zero transition occurred.

Whenever the /SCLR inputs to modules 10, 16, 18, 20 and 22 of Gray code counter 9 transition to the logic zero state and the clock signal of FIG. 5E then transitions from a logic zero to a logic one circuit 12, FIG. 2, is synchronously cleared and the state machine of FIG. 4 transitions from the particular state the state machine of FIG. 4 was at when the logic one to logic zero transition occurred to state S1. It should be noted that the synchronous clear signal illustrated in FIG. 5B is clock dependent, while the asynchronous clear signal illustrated in FIG. 5D is not dependent on the clock signal, that is a logic one to zero transition of the asynchronous clear signal of FIG. 5D clears circuits 12 of each module 10, 16, 18, 20 and 22 of Gray code counter 9.

Figure 3:
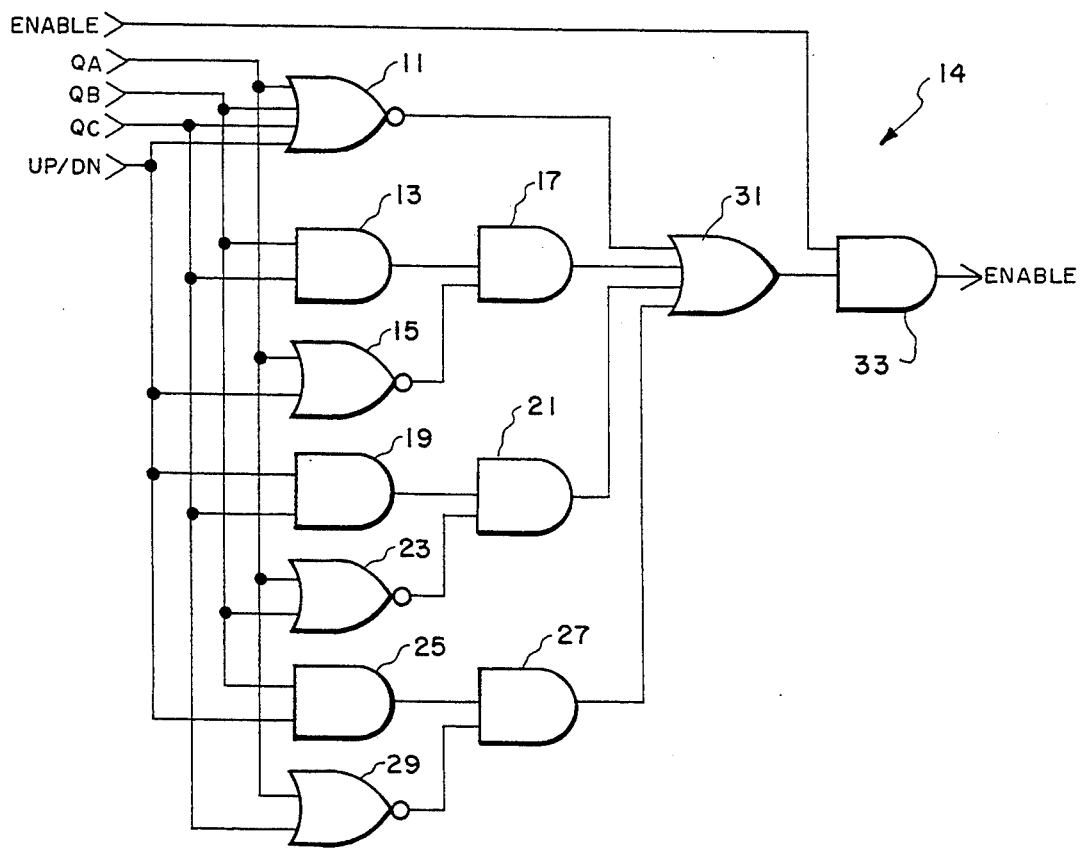

Referring now to FIGS. 2 and 3 there is shown a circuit 14 which provides the logic one enable signal to each successive modules 10, 16, 18, 20 and 22 of Gray code counter 9. For the enable output of circuit 14 to transition to the logic one state, the enable input to circuit 14 must be at the logic one state. This, in turn, results in a logic one at the first input of AND gate 33.

Whenever modules 10, 16, 18, 20 and 22 of Gray code counter 9 are in an UP count mode of operation, that is the module 10 is providing at its QA, QB and QC outputs the count shown in Table I, a logic one is supplied to the UP_DN input of circuit 14 resulting in a logic one being supplied to AND gates 19 and 25 and NOR gates 11 and 15. When the count is 0, 1, 0 a logic one is supplied to AND gate 25 which is already enabled allowing the logic one to pass through AND gate 25 to AND gate 27. Since both inputs to NOR gate 29 are at the logic zero state (QA and QC inputs of circuit 14 are logic zeros) the output of NOR gate 29 will be at the logic one state resulting in logic ones at both inputs of AND gate 27. This, in turn, results in a logic one at the output of AND gate 27 which then passes through OR gate 31 and AND gate 33 to the enable output of circuit 14.

As is best illustrated in the following Table, circuit 14 of each module 10, 16, 18, 20 and 22 of Gray code counter 9 will generate a logic one at its enable output under the following input conditions:

TABLE III

| Output of Circuit 14 Enable Input | UP/DN | QC | QB | QA | X = Don't Care Enable Output |
|---|---|---|---|---|---|
| 1 | 1 | 0 | 1 | 0 | 1 |
| 1 | 1 | 1 | 0 | 0 | 1 |
| 1 | 0 | 1 | 1 | 0 | 1 |
| 1 | 0 | 0 | 0 | 0 | 1 |
| 0 | X | X | X | X | 0 |

For an N-bit Gray code counter the enable circuit of each module will generate a logic one signal at its enable output under the following conditions:

TABLE IV

| Output of Enable Circuit Enable Input | UP/DN | $Q_{N-1}$ | $Q_{N-2}$ | $Q_{N-3...0}$ | X = Don't Care Enable Output |
|---|---|---|---|---|---|
| 1 | 1 | 0 | 1 | 0...0 | 1 |
| 1 | 1 | 1 | 0 | 0...0 | 1 |
| 1 | 0 | 1 | 1 | 0...0 | 1 |
| 1 | 0 | 0 | 0 | 0...0 | 1 |
| 0 | X | X | X | X...X | 0 |

Referring to FIG. 1 the following expressions may be utilized to determined the number of modules required for a particular Gray code count:

$$B_T = N + X(N-1) \quad (1)$$

$$A = X + 1 \quad (2)$$

where $B_T$ is the total number of bits for the Gray code count, N is the bits provided by each module and A is the number of modules required for the Gray code counter. For the circuit of FIG. 1, N is three, $B_T$ is eleven, that is Gray code counter 9 provides eleven output binary bits Q0–Q10 and A is five, that is Gray code counter 9 has five modules 10, 16, 18, 20 and 22.

Each output of the Gray code counter of FIG. 1, that is outputs QA, QB and QC of the state machines 12 of each of the modules 10, 16, 18, 20 and 22 of the Gray code counter 9 may be represented by the output of a D-type or JK Flip-Flop. The state machine 12 for each module of Gray code counter 9 is a Moore machine which is a state machine where an output is a function of only the present state and is independent of an external input.

The following expression defines the number of Flip-Flops required to implement an N-bit Gray code counter of the type illustrated in FIG. 1:

$$N_f = B_T + O_{MSB}$$

where $N_f$ is the Flip-Flops required to implement the Gray Code counter, $B_T$ is the total number of bits for the Gray code count, $O_{MSB}$ represents the most significant bit provided by each module of the counter which is not being used as an output of the Gray code counter. For the circuit of FIG. 1, $O_{MSB}$ is four (bit QC of modules 10, 16, 18 and 20), $B_T$ is eleven and $N_f$ is fifteen.

It should be noted that implementing the modular Gray code counter of the present invention requires that the most significant module utilize all the output bits provided by the module as the most significant bits of the count signal provided by the Gray code counter. Thus, all the output bits QA, QB and QC of module 22 are used in the count signal provided Gray code counter 9, that is QC, QB and QA are respectively output bits Q10, Q9 and Q8 of the count signal. Only output bits QA and QB of modules 10, 16, 18 and 20 are used in the count signal provided by Gray code counter 9, that is output bits QA and QB are output bits Q0–Q7 of the count signal.

Referring to FIGS. 1 through 5, there is shown a timing diagram, FIGS. 5A–5K, illustrating the operation of the Gray code counter 9 of FIG. 1. When the UP/DN input of Gray code counter 9, FIG. 5A, is at the logic one state, Gray code counter 9 is in an up count mode of operation. Since only module 10 is enabled (only EN signal of FIG. 5C is a logic one), the first clock pulse of the clock signal of FIG. 5E causes the state machine of circuit 12 to transition from state S1 to state S2 which results in module 10 providing at its QC, QB and QA outputs respectively 0, 0, 1 (count 001 hexadecimal, FIG. 5F). The second clock pulse of the clock signal of FIG. 5E causes the state machine of circuit 12 to transition from state S2 to state S3 which results in module 10 providing at its QC, QB and QA outputs respectively 0, 1, 1 (count 003 hexadecimal, FIG. 5F). The third clock pulse of the clock signal of FIG. 5E causes the state machine of circuit 12 to transition from state S3 to state S4 which results in module 10 providing at its QC, QB and QA outputs respectively 0, 1, 0 (count 002 hexadecimal, FIG. 5F).

Since the leading edge of the third clock pulse of the clock signal of FIG. 5E results in module 10 providing at its QC, QB and QA outputs respectively 0, 1, 0, the en12 signal of FIG. 5G will transition to the logic one state enabling module 16 as is best illustrated in Table III. However, when the UP/DN input of Gray code counter 9 transitions to the logic zero state, FIG. 5A, Gray code counter 9 enters a down count mode of operation and the logic zero of FIG. 5A is provided to the enable input of circuit 14. This causes the en12 signal of FIG. 5G to transition to the logic zero state disabling module 16 (see Table III) prior to the forth clock pulse of the clock signal of FIG. 5E.

Since Gray code counter 9 is now in a down count mode of operation, the fourth clock pulse of the clock signal of FIG. 5E causes the state machine of circuit 12 to transition from state S4 to state S3 which results in module 10 providing at its QC, QB and QA outputs respectively 0, 1, 1 (count 003 hexadecimal, FIG. 5F). The fifth clock pulse of the clock signal of FIG. 5E causes the state machine of circuit 12 to transition from state S3 to state S2 which results in module 10 providing at its QC, QB and QA outputs respectively 0, 0, 1 (count 001 hexadecimal, FIG. 5F).

The sixth clock pulse of the clock signal of FIG. 5E causes the state machine of circuit 12 to transition from state S2 to state S1 which results in module 10 providing at its QC, QB and QA outputs respectively 0, 0, 0 (count 000 hexadecimal, FIG. 5F). The sixth clock pulse of the clock signal of FIG. 5E also causes circuit 14 of each of the modules 10, 16, 18, 20 and 22 of Gray code counter 9 to transition to the logic one state as best illustrated by the FIGS. 5G, 5H, 5I, 5J and 5K (see Table III).

Since modules 10, 16, 18, 20 and 22 of Gray code counter 9 are now enabled the seventh clock pulse of the clock signal of FIG. 5F will cause the state machine of circuit 12 of each of the modules 10, 16, 18, 20 and 22 of Gray code counter 9 to transition from state S1 to state S8. This results in a count at the QC, QB and QA outputs of modules 10, 16, 18, 20 and 22 respectively of 1, 0, 0. Since only the QC output of module 22 is provided as an output of Gray code counter 9 the binary count at the Q10 through Q0 outputs of Gray code counter 9 is 10000000000 (hexadecimal 400, FIG. 5F). The leading edge of the seventh clock pulse of the clock signal of FIG. 5E also causes the en12, en23, en34, en45 and en56 signals of FIGS. 5G through 5K to transition to the logic zero state, thereby disabling modules 16, 18, 20 and 22 of Gray code counter 9. The eighth clock pulse of the clock signal of FIG. 5E will result in only the state machine of module 10 transitioning from state S8 to state S7 since modules 16, 18, 20 and 22 are disabled. This results in a count at the Q10 through Q0 outputs of Gray code counter 9 of 10000000001 (hexadecimal 401, FIG. 5F).

It should be noted that Gray code counter 9 is cleared only on the leading edge of the first clock pulse, designated as pulse 25 of FIG. 5E, which occurs after the logic one to zero transition of the /SCLR signal of FIG. 5B. Gray code counter 9 then remains in a cleared state until the logic zero to one transition of the /SCLR signal of FIG. 5B and the leading edge of the first clock pulse, designated as pulse 27 of FIG. 5E, which occurs after the zero to one transition of the /SCLR signal of FIG. 5B. The logic one to zero transition of /ACLR signal of FIG. 5D immediately clears Gray code counter 9 and the clearing of Gray code counter is not dependent upon the clock signal of FIG. 5E.

An erasable programmable logic device may, for example, be used to implement the embodiment of the present invention as illustrated in FIGS. 1–4. A preferred erasable programmable logic device for implementing the Gray code counter of the present invention is the Altera Corporation Model EPM5128J erasable programmable logic device. Appendix A is a program listing for the state machine of FIG. 4 which was generated using a computer software program entitled "MAX+PLUS AHDL (Altera Hardware Description Language)" and which is also produced by Altera Corporation of San Jose, Calif., the manufacturer of the erasable programmable logic device.

It should further be noted that, for example, the Gray code counter of the present invention may have modules which provide the Gray count set forth as follows:

TABLE V

COUNTING SEQUENCE FOR FOUR BIT GRAY CODE COUNTER

| | Q4 | Q3 | Q2 | Q1 |
|---|---|---|---|---|
| increment | 0 | 0 | 0 | 0 |

TABLE V-continued

COUNTING SEQUENCE FOR FOUR BIT GRAY CODE COUNTER

| Q4 | Q3 | Q2 | Q1 |
|---|---|---|---|
| 0 | 0 | 0 | 1 |
| 0 | 0 | 1 | 1 |
| 0 | 0 | 1 | 0 |
| 0 | 1 | 1 | 0 |
| 0 | 1 | 1 | 1 |
| 0 | 1 | 0 | 1 |
| 0 | 1 | 0 | 0 |
| 1 | 1 | 0 | 0 |
| 1 | 1 | 0 | 1 |
| 1 | 1 | 1 | 1 |
| 1 | 1 | 1 | 0 |
| 1 | 0 | 1 | 0 |
| 1 | 0 | 1 | 1 |
| 1 | 0 | 0 | 1 |
| 1 | 0 | 0 | 0 |

To implement the modules of a Gray code counter which would provide the Gray code count set forth in Table V would require a state machine having sixteen states S1 though S16 This state machine would provide each count of the four bit Gray code. An enable circuit of the type illustrated in FIG. 3 for each module of the Gray code counter would be required to provide a logic one enable signal during an up count whenever the count of the module is 0100 or 1000. The enable circuit for each module of the Gray code counter would also be required to provide a logic one enable signal during a down count whenever the count of the module is 0000 or 1100. The design of the state machine and the enable circuit of a four bit module for a Gray code counter is well within the purview of those skilled in the art in view of the teachings set forth above and thus will not be discussed in detail.

From the foregoing, it may readily be seen that the present invention comprises a new, unique and exceedingly useful Gray code counter. Obviously, many modifications and variations of the present invention are possible in light of the above teachings. It is, therefore to be understood that within the scope of the appended claims the invention may be practiced otherwise than as specifically described.

APPENDIX A

```
SUBDESIGN a4
(
    clk         : INPUT;
    _aclr       : INPUT;
    qa,qb,qc    : OUTPUT;
    en          : INPUT;
    _sclr       : INPUT;
    up_dwn      : INPUT;
)
VARIABLE
    count : MACHINE OF BITS    (g2,g1,g0)
            WITH STATES        (s1 = b"000",
                                s2 = b"001",
                                s3 = b"011",
                                s4 = b"010",
                                s5 = b"110",
                                s6 = b"111",
                                s7 = b"101",
                                s8 = b"100");
BEGIN
    count.clk = clk;
    count.reset = !_aclr;
    qa = g0;
    qb = g1;
    qc = g2;
    CASE count IS
        WHEN s1 =>
```

APPENDIX A

```
        IF _sclr == 0 THEN
            count = s1;
        ELSIF en == 0 THEN
            count = s1;
        ELSIF up_dwn == 0 THEN
            count = s8;
        ELSE
            count = s2;
        END IF;
    WHEN s2 =>
        IF _sclr == 0 THEN
            count = s1;
        ELSIF en == 0 THEN
            count = s2;
        ELSIF up_dwn == 0 THEN
            count = s1;
        ELSE
            count = s3;
        END IF;
    WHEN s3 =>
        IF _sclr == 0 THEN
            count = s1;
        ELSIF en == 0 THEN
            count = s3;
        ELSIF up_dwn == 0 THEN
            count = s2;
        ELSE
            count = s4;
        END IF;
    WHEN s4 =>
        IF _sclr == 0 THEN
            count = s1;
        ELSIF en == 0 THEN
            count = s4;
        ELSIF up_dwn == 0 THEN
            count = s3;
        ELSE
            count = s5;
        END IF;
    WHEN s5 =>
        IF _sclr == 0 THEN
            count = s1;
        ELSIF en == 0 THEN
            count = s5;
        ELSIF up_dwn == 0 THEN
            count = s4;
        ELSE
            count = s6;
        END IF;
    WHEN s6 =>
        IF _sclr == 0 THEN
            count = s1;
        ELSIF en == 0 THEN
            count = s6;
        ELSIF up_dwn == 0 THEN
            count = s5;
        ELSE
            count = s7;
        END IF;
    WHEN s7 =>
        IF _sclr == 0 THEN
            count = s1;
        ELSIF en == 0 THEN
            count = s7;
        ELSIF up_dwn == 0 THEN
            count = s6;
        ELSE
            count = s8;
        END IF;
    WHEN s8 =>
        IF _sclr == 0 THEN
            count = s1;
        ELSIF en == 0 THEN
            count = s8;
        ELSIF up_dwn == 0 THEN
            count = s7;
        ELSE
            count = s1;
        END IF;
END CASE;
END;
```

What is claimed is:

1. A synchronous modular N-stage Gray code counter producing an N bit count signal having output count bits $Q_1$-$Q_N$, said Gray code counter comprising:

low bit modular circuit means for generating at least a pair of least significant output count bits of said N bit count signal having lowest bit weights for said Gray code counter;

high bit modular circuit means for generating at least a trio of most significant output count bits of said N bit count signal having highest bit weights for said counter;

at least one middle bit modular circuit means electrically coupled between said low bit modular circuit means and said high bit modular circuit means;

said at least one middle bit modular circuit means generating at least a pair of middle output count bits of said N bit count signal having intermediate bit weights between the lowest bit weights and the highest bit weights of the output count bits of said N bit count signal;

wherein each of said low bit, said high bit and said at least one middle bit modular circuit means comprises:

a state machine circuit for receiving an input clock signal and an input enable signal, said state machine circuit being enabled by said input enable signal;

said state machine circuit when enabled being responsive to said input clock signal and generating sequential binary counts having at least output binary bits QA, QB, QC, each of said sequential binary counts differing from the preceding binary count by one bit in one place only; and an enable logic circuit coupled to said state machine circuit for receiving said output binary bits QA, QB and QC and said input enable signal, said enable logic circuit responsive to said output binary bits QA, QB and QC and said input enable signal generating an output enable signal, said output enable signal generated by the enable logic circuit of one of said modular circuit means being provided to another of said modular circuit means as said input enable signal for said another modular circuit means.

2. The synchronous modular N-stage Gray Code counter of claim 1 wherein the number of modular circuit means comprising said Gray Code counter is defined by the equations:

$$B_T = N + X(N-1)$$

$$A - X + 1$$

where $B_T$ is the number of said output count bits $Q_1$-$Q_N$ provided by said Gray Code counter, N is the number of said output binary bits provided by each of said modular circuit means, A is the number of modular circuit means for said Gray Code counter and X is a variable integer which is one less than the number of modular circuit means comprising said Gray Code counter.

3. A synchronous modular N-stage Gray code counter producing an N bit count signal, said Gray code counter comprising:

first modular circuit means for generating a pair of least significant count bits $Q_1$ and $Q_2$ of said N bit count signal having lowest bit weights for said counter with respect to more significant count bits $Q_3$-$Q_N$ of said N bit count signal;

last modular circuit means for generating a trio of most significant count bits $Q_{N-2}$, $Q_{N-1}$ and $Q_N$ of said N bit count signal having highest bit weights for said counter with respect to less significant count bits $Q_2$-$Q_{N-3}$ of said N bit count signal; and a plurality of middle modular circuit means coupled between said first modular circuit means and said last modular circuit means, each of said middle modular circuit means generating a pair of middle bits $Q_M$ and $Q_{M+1}$ of said N bit count signal;

said pair of middle bits $Q_M$ and $Q_{M+1}$ of said N bit count signal generated by each of said middle modular circuit means having intermediate bit weights between said lowest bit weight of said least significant count bit $Q_2$ and said highest bit weight of said most significant count bit $Q_{N-2}$ wherein $2 < M < M+1 < N-2$;

wherein said first, said last and said middle modular circuit means are each coupled to receive an input clock signal and to synchronously generate said count bits $Q_1$-$Q_N$ of said N bit count signal;

each of said first, said last and said plurality of middle modular circuit means comprising:

a state machine circuit for receiving said input clock signal and an input enable signal, said state machine circuit being enabled by said input enable signal;

said state machine circuit when enabled being responsive to said input clock signal and generating sequential three bit binary counts having output binary bits QA, QB and QC, each of said sequential three bit binary counts differing from the preceding three bit binary count by one bit in one place only; and an enable logic circuit coupled to said state machine circuit for receiving said output binary bits QA, QB and QC and said input enable signal, said enable logic circuit responsive to said output binary bits QA, QB and QC and said input enable signal generating an output enable signal.

4. The synchronous modular N-stage Gray code counter of claim 3 wherein said enable logic circuit comprises:

a NOR gate (11) having first, second, third and fourth inputs and an output, the first, second and third inputs of said NOR gate (11) respectively receiving said output binary bits QA, QB and QC and the fourth input of said NOR gate (11) receiving an external up-down count signal;

an AND gate (13) having a first input for receiving said binary bit QB, a second input for receiving said binary bit QC and an output;

a NOR gate (15) having a first input for receiving said binary bit QA, a second input for receiving said external up-down count signal and an output;

an AND gate (17) having a first input connected to the output of said AND gate (13), a second input connected to the output of said NOR gate (15) and an output;

an AND gate (19) having a first input for receiving said external up-down count signal, a second input for receiving said binary bit QC and an output;

a NOR gate (23) having a first input for receiving said binary bit QA, a second input for receiving said binary bit QB and an output;

an AND gate (21) having a first input connected to the output of said AND gate (19), a second input connected to the output of said NOR gate (23) and an output;

an AND gate (25) having a first input for receiving said external up-down count signal, a second input for receiving said binary bit QB and an output;

a NOR gate (29) having a first input for receiving said binary bit QA, a second input for receiving said binary bit QC and an output;

an AND gate (27) having a first input connected to the output of said AND gate (25), a second input connected to the output of said NOR gate (29) and an output;

an OR gate (31) having a first input connected to the output of said NOR gate (11), a second input connected to the output of said AND gate (17), a third input connected to the output of said AND gate (21) and a fourth input connected to the output of said AND gate (27); and an AND gate (33) having a first input connected to the output of said OR gate (31) and a second input for receiving said input enable signal;

said AND gate (33) having an output for providing said output enable signal.

5. The synchronous modular N-stage Gray Code counter of claim 3 wherein the number of modular circuit means comprising said Gray Code counter is defined by the equations:

$$B_T = N + X(N-1)$$

$$A = X + 1$$

where $B_T$ is the number of said count bits $Q_1$-$Q_N$ provided by said Gray Code counter, N is the number of said output binary bits provided by each of said modular circuit means, A is the number of modular circuit means for said Gray Code counter and X is a variable integer which is one less than the number of modular circuit means comprising said Gray Code counter.

6. A synchronous modular 5-stage Gray code counter producing an eleven bit count signal having output count bits Q0-Q10, said Gray code counter comprising:

a first modular circuit for receiving an input clock signal and an external enable signal, said first modular circuit responsive to said input clock signal and said external enable signal generating output count bits Q0 and Q1 of said eleven bit count signal and a first internal enable signal;

a second modular circuit coupled to said first modular circuit, said second modular circuit receiving said input clock signal and said first internal enable signal, said second modular circuit responsive to said input clock signal and said first internal enable signal generating output count bits Q2 and Q3 of said eleven bit count signal and a second internal enable signal;

a third modular circuit coupled to said second modular circuit, said third modular circuit receiving said input clock signal and said second internal enable signal, said third modular circuit responsive to said input clock signal and said second internal enable signal generating output count bits Q4 and Q5 of said eleven bit count signal and a third internal enable signal;

a fourth modular circuit coupled to said third modular circuit, said fourth modular circuit receiving said input clock signal and said third internal enable signal, said fourth modular circuit responsive to said input clock signal and said third internal enable signal generating output count bits Q6 and Q7 of said eleven bit count signal and a fourth internal enable signal; and a fifth modular circuit coupled to said forth modular circuit, said fifth modular circuit receiving said input clock signal and said fourth internal enable signal, said fifth modular circuit responsive to said input clock signal and said fourth internal enable signal generating output count bits Q8, Q9 and Q10 of said eleven bit count signal and a fifth internal enable signal;

each of said first, second, third, fourth and fifth modular circuits comprising:

a state machine circuit for receiving said input clock signal and one of said external, first internal, second internal, third internal, fourth internal and fifth internal enable signals, said state machine circuit being enabled by said one of said external, first internal, second internal, third internal, fourth internal and fifth internal enable signals;

said state machine circuit when enabled being responsive to said clock signal and generating sequential three bit binary counts having output binary bits QA, QB, QC, each of said sequential three bit binary counts differing from the preceding three bit binary count by one bit in one place only; and an enable logic circuit coupled to said state machine circuit for receiving said output binary bits QA, QB and QC and said one of said external, first internal, second internal, third internal, fourth internal and fifth internal enable signals;

said enable logic circuit responsive to said output binary bits QA, QB and QC and said one of said external, first internal, second internal, third internal, fourth internal and fifth internal enable signals generating another of said first, second, third, fourth and fifth internal enable signals.

7. The synchronous modular 5-stage Gray code counter of claim 6 wherein said enable logic circuit of each of said modular circuits comprises:

a NOR gate (11) having first, second, third and fourth inputs and an output, the first, second and third inputs of said NOR gate (11) respectively receiving said binary bits QA, QB and QC and the fourth input of said NOR gate (11) receiving an external up-down count signal;

an AND gate (13) having a first input for receiving said binary bit QB, a second input for receiving said binary bit QC and an output;

a NOR gate (15) having a first input for receiving said binary bit QA, a second input for receiving said external up-down count signal and an output;

an AND gate (17) having a first input connected to the output of said AND gate (13), a second input connected to the output of said NOR gate (15) and an output;

an AND gate (19) having a first input for receiving said external up-down count signal, a second input for receiving said binary bit QC and an output;

a NOR gate (23) having a first input for receiving said binary bit QA, a second input for receiving said binary bit QB and an output;

an AND gate (21) having a first input connected to the output of said AND gate (19), a second input connected to the output of said NOR gate (23) and an output;

an AND gate (25) having a first input for receiving said external up-down count signal, a second input for receiving said binary bit QB and an output;

a NOR gate (29) having a first input for receiving said binary bit QA, a second input for receiving said binary bit QC and an output;

an AND gate (27) having a first input connected to the output of said AND gate (25), a second input connected to the output of said NOR gate (29) and an output;

an OR gate (31) having a first input connected to the output of said NOR gate (11), a second input connected to the output of said AND gate (17), a third input connected to the output of said AND gate (21) and a fourth input connected to the output of said AND gate (27); and an AND gate (33) having a first input connected to the output of said OR gate (31) and a second input for receiving said one of said external, first internal, second internal, third internal, fourth internal and fifth internal enable signals;

said AND gate (33) having an output for providing said another of said first, second, third, fourth and fifth internal enable signals.

8. The synchronous modular 5-stage Gray Code counter of claim 6 wherein the output binary bits QA and QB provided by the state machine circuit of said first modular circuit are respectively the Q0 and Q1 count bits of said eleven bit count signal, the output binary bits QA and QB provided by the state machine circuit of said second modular circuit are respectively the Q2 and Q3 binary bits of said eleven bit count signal, the output binary bits QA and QB provided by the state machine circuit of said third modular circuit are respectively the Q4 and Q5 count bits of said eleven bit count signal, the output binary bits QA and QB provided by the state machine circuit of said fourth modular circuit are respectively the Q6 and Q7 count bits of said eleven bit count signal, and the output binary bits QA, QB and QC provided by the state machine circuit of said fifth modular circuit are respectively the Q8, Q9 and Q10 count bits of said eleven bit count signal.

9. The synchronous modular 5-stage Gray Code counter of claim 6 wherein the number of modular circuits comprising said Gray Code counter is defined by the equations:

$$B_T = N + X(N-1)$$

$$A = X + 1$$

where $B_T$ is the number of said output count bits provided by said Gray Code counter, N is the number of said output binary bits provided by each of said modular circuits. A is the number of modular circuits for said Gray Code counter, and X is a variable integer which is one less than the number of modular circuits comprising said Gray Code counter.

* * * * *